United States Patent
Kato (10) Patent No.: US 6,587,177 B2
(45) Date of Patent: Jul. 1, 2003

(54) CONNECTION STRUCTURE OF DISPLAY DEVICE WITH A PLURALITY OF IC CHIPS MOUNTED THEREON AND WIRING BOARD

(75) Inventor: Shin-ichi Kato, Higashiyamato (JP)

(73) Assignee: Casio Computer Co., Ltd., Tokyo (JP)

( * ) Notice: Subject to any disclaimer, the term of this patent is extended or adjusted under 35 U.S.C. 154(b) by 331 days.

(21) Appl. No.: 09/772,660

(22) Filed: Jan. 30, 2001

(65) Prior Publication Data

US 2002/0018169 A1 Feb. 14, 2002

(30) Foreign Application Priority Data

Feb. 2, 2000 (JP) .................................. 2000-024872
Feb. 4, 2000 (JP) .................................. 2000-027040

(51) Int. Cl.[7] .......................................... G02F 1/1336
(52) U.S. Cl. ...................................... 349/151; 349/152
(58) Field of Search ................................ 349/151, 152; 174/262

(56) References Cited

U.S. PATENT DOCUMENTS 6,406,946 B1 * 6/2002 Takizawa et al. ........... 438/149

* cited by examiner

Primary Examiner—James Dudek
(74) Attorney, Agent, or Firm—Frishauf, Holtz, Goodman & Chick, P.C.

(57) ABSTRACT

A plurality of semiconductor chip mounting areas are arranged in series on the top surface of the lower edge section of the lower glass substrate of a liquid crystal display panel. In the semiconductor chip mounting areas, signal input electrode terminals are provided in a cascade. The signal input electrode terminals are connected to each other by means of input wires each having an inside semiconductor chip mounting area junction section and an outside semiconductor chip mounting area junction section.

14 Claims, 11 Drawing Sheets

CONNECTION STRUCTURE OF DISPLAY DEVICE WITH A PLURALITY OF IC CHIPS MOUNTED THEREON AND WIRING BOARD

CROSS-REFERENCE TO RELATED APPLICATIONS

This application is based upon and claims the benefit of priority from the prior Japanese Patent Applications No. 2000-024872, filed Feb. 2, 2000; and No. 2000-027040, filed Feb. 4, 2000, the entire contents of which are incorporated herein by reference.

BACKGROUND OF THE INVENTION

This invention relates to a connection structure of a display device on which a plurality of IC chips are mounted by, for example, the COG (Chip On Glass) method and a wiring board.

Figure 9:
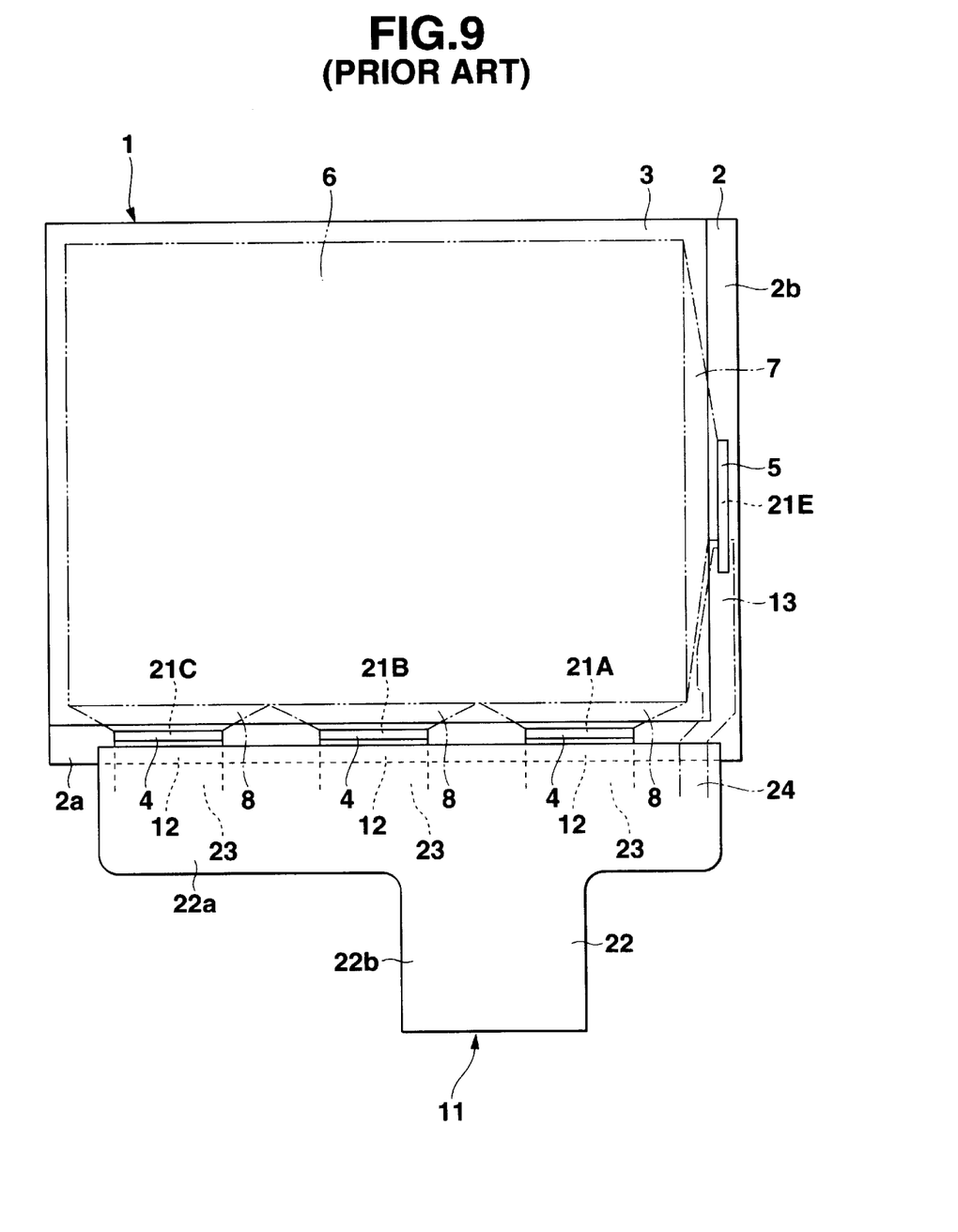
FIG. 9 is a plan view showing an example of a conventional liquid crystal display unit.

FIG. 9 is a plan view of a conventional liquid crystal display unit. The liquid crystal display unit includes an active matrix type liquid crystal panel 1. The liquid crystal display panel 1 is such that a lower glass substrate 2 and an upper glass substrate 3 are overlapped together with seal material (not shown) therebetween, with liquid crystal (not shown) sealed between the substrates. The display panel 1 has a display area inside the area represented by a two-dots-dash line and an undisplayed area outside the two-dots-dash line area. In this case, the lower glass substrate 2 has a larger area than that of the upper glass substrate 3 and includes a lower edge section 2a projecting from below the lower end (in the figure) of the upper glass substrate 3 and a right edge section 2b projecting from the right end of the substrate 3.

On the lower edge section 2a of the lower glass substrate 2, three semiconductor chip mounting areas 21A, 21B, and 21C are arranged in series. In each of the semiconductor chip mounting areas 21A, 21B, 21C, a semiconductor chip 4 for supplying a data signal is mounted on the lower edge section 2a with anisotropic conductive adhesive (not shown) by the COG (Chip On Glass) method. On the right edge section 2b of the lower glass substrate 2, there is provided a semiconductor chip mounting area 21E, on which a semiconductor chip 5 for supplying a scanning signal is mounted via anisotropic conductive adhesive (now shown).

Although not shown, a plurality of scanning lines extending in the direction of row (or in the horizontal direction in FIG. 9) and a plurality of signal lines extending in the direction of column (or in the vertical direction in FIG. 9) are provided in the area of the lower glass substrate 2 corresponding to the display area 6 enclosed by the two-dots-dash line. The right ends of the scanning lines are connected via output wires 7 provided on the top surface of the lower glass substrate 2 to the semiconductor chip 5 mounted on the right edge section 2b. This connection enables the semiconductor chip 5 to supply scanning line driving signals to the plurality of scanning lines. The lower ends of the signal lines are connected to the corresponding semiconductor chips 4 via output wires 8 provided on the top surface of the lower glass substrate 2. With this connection, the three semiconductor chips 4 mounted on the lower edge section 2b supply signal line driving signals to the individual signal lines.

In the vicinity of the outside of the semiconductor chip mounting areas 21A, 21B, 21C, one end of a flexible wiring board 11 is mounted on the lower edge section 2a of the lower glass substrate 2. The flexible wiring board 11 and the semiconductor chips 4 are electrically connected to input wire groups 12 provided in three places, one group in one place, on the lower edge section 2a of the lower glass substrate 2 via anisotropic conductive adhesive (not shown). The flexible wiring board 11 and the semiconductor chip 5 on the right edge section 2b are electrically connected via an input wiring group 13 provided on the right edge section 2b of the lower glass substrate 2 and its peripheral section.

Figure 10A:
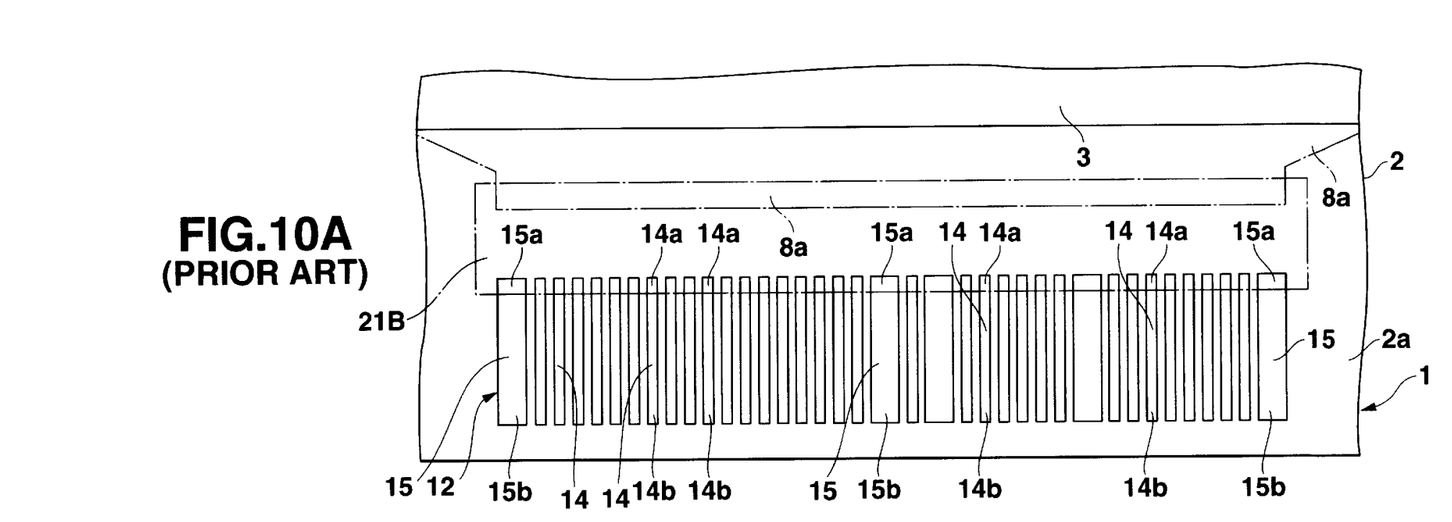
FIG. 10A is an enlarged plan view of the left edge section of the liquid crystal display unit in FIG. 9.

FIG. 10A is an enlarged plan view of the vicinity of the semiconductor chip mounting areas 21A, 21B, 21C of the lower edge section 2a of the liquid crystal display panel 1 shown in FIG. 9. Since the inside of each of the semiconductor chip mounting areas 21A, 21B, 21C and its vicinity have the same configuration, the vicinity of the semiconductor chip mounting area 21B positioned in the middle is taken as an example. In FIG. 10A, the semiconductor chip 4 mounted on the semiconductor chip mounting area 21B is not shown. The area enclosed by a one-dot-dash line on the top surface of the lower edge section 2a of the lower glass substrate 2 is the semiconductor chip mounting area 21B on which a semiconductor chip 4 is mounted. The input wiring group 12 is composed of a plurality of narrow signal input wires 14 and five wide power supply wires 15. In this case, the signal input wires 14 and power supply wires 15 are arranged according to the specification of the semiconductor chip 4 (or the location of a signal input bump electrode and a power supply bump electrode) explained later.

Each of the signal input wires 14 and power supply wires 15 is extended straightly from the inside of the semiconductor chip mounting area 21B up to the vicinity of the side end of the lower glass substrate 2. Each signal input wire 14 has an electrode terminal 14a located at the lower edge section inside the semiconductor chip mounting area 21B and a terminal 14b near the side end of the lower glass substrate 2. Each power supply wire 15 has an electrode terminal 15a located at the lower edge section inside the semiconductor chip mounting area 21B and a terminal 15b near the side end of the lower glass substrate 2.

The signal input wires 14 and power supply wires 15 are made of transparent metal, such as ITO (Indium Tin Oxide). The reason why the power supply wire 15 is made wider than the signal input wire 14 is to reduce the wire resistance, because a larger current flows through the power supply wire 15 than through the signal input wire 14. The input wire group 13, whose detailed view is not given, is composed of a plurality of power supply wires and control signal input wires for connecting the flexible wiring board 11 with the semiconductor chip 5.

As shown in FIG. 9, the flexible wiring board 11 is provided with a film 22 having a wide section 22a and a narrow section 22b extended from almost the middle of the lower part of the wide section 22a. On the bottom surface of the wide section 22a of the film 22, three connection wire groups 23 corresponding to the respective three input wire groups are formed. The middle connection wire group is shown in a transparent enlarged plan view of FIG. 10B (or an enlarged plan view of the central portion with the film 22 removed from above as in FIG. 10A). Each connection wire group 23 corresponds to each input wire group 12 and is composed of a plurality of narrow input connection wires 24 corresponding to the signal input wires 14 and five wide power supply connection wires 25 corresponding to the power supply wires 15. Each input connection wire 24 has a connection terminal 24a connected to the terminal 14b of the corresponding signal input wire 15 at its upper end. Each power supply connection wire 25 has a connection terminal 25a connected to the power supply terminal 15b of the corresponding power supply wire 15 at its upper end.

Figure 10B:
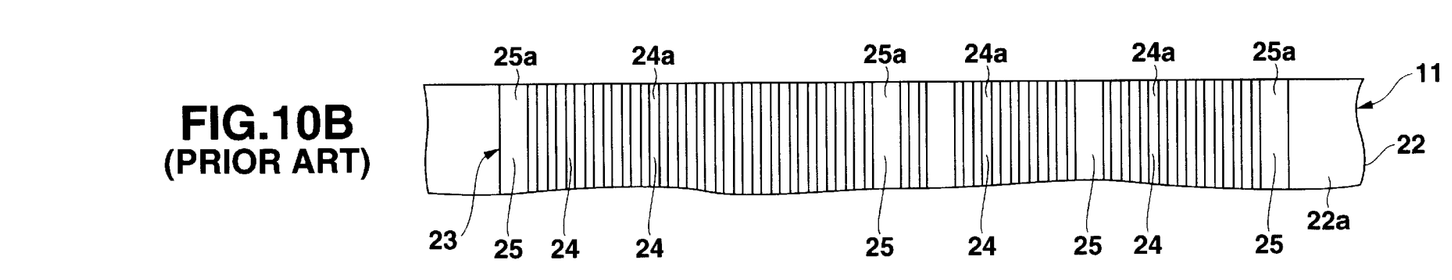
FIG. 10B is a transparent enlarged plan view of the part of the flexible wiring board corresponding to the area of the liquid crystal display panel shown in FIG. 10A.

A plurality of input connection wires 24 and five power supply connection wires 25 constituting the middle connection wire group 23 formed at the wide section of the flexible wiring board 11 are extended to the lower end edge of the narrow section 22b of the film 22 and connected to a circuit board (not shown). On the other hand, input connection wires 24 and power supply connection wires 25 constituting the remaining two connection wire groups 23 are connected to the corresponding input connection wires 24 or power supply connection wires 25 of the middle connection wire groups 23 via running wires so formed through holes and on the top surface of film 22 that they traverse the input connection wires 24 and power supply connection wires 25.

Specifically, the flexible wiring board 11 is a double-sided wiring board where the three connection wire groups 23 are formed on the bottom surface of the film 22, each group composed of a plurality of input connection wires 24 and five power supply connection wires 25, and the running wires 22 formed on the top surface of the film 22 and connecting the input connection wires 24 and power supply connection wires 25 of the middle connection wire group 23 with the input connection wires 24 and power supply connection wires 25 of the right and left connection wire groups 23, respectively. The three connection wire groups 23 are provided in parallel on the bottom surface of the wide section 22a of the film 22. Of the three groups, only the middle connection wire group 23 is extended to the lower end edge of the narrow section 22b of the film 22.

Figure 11A:
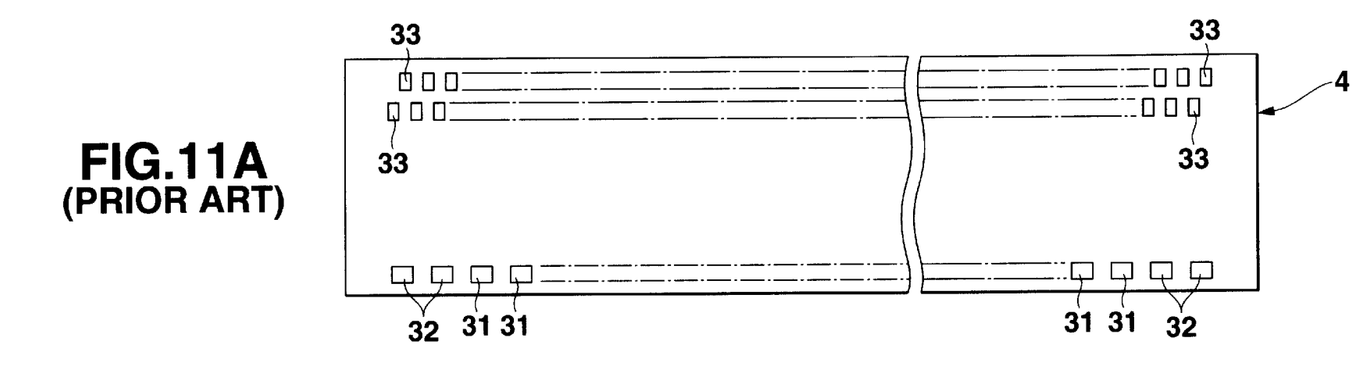
FIG. 11A is a transparent enlarged plan view showing the location of the terminals of a semiconductor chip mounted on the semiconductor chip mounting area on the liquid crystal display panel of FIG. 10A.
Figure 11B:
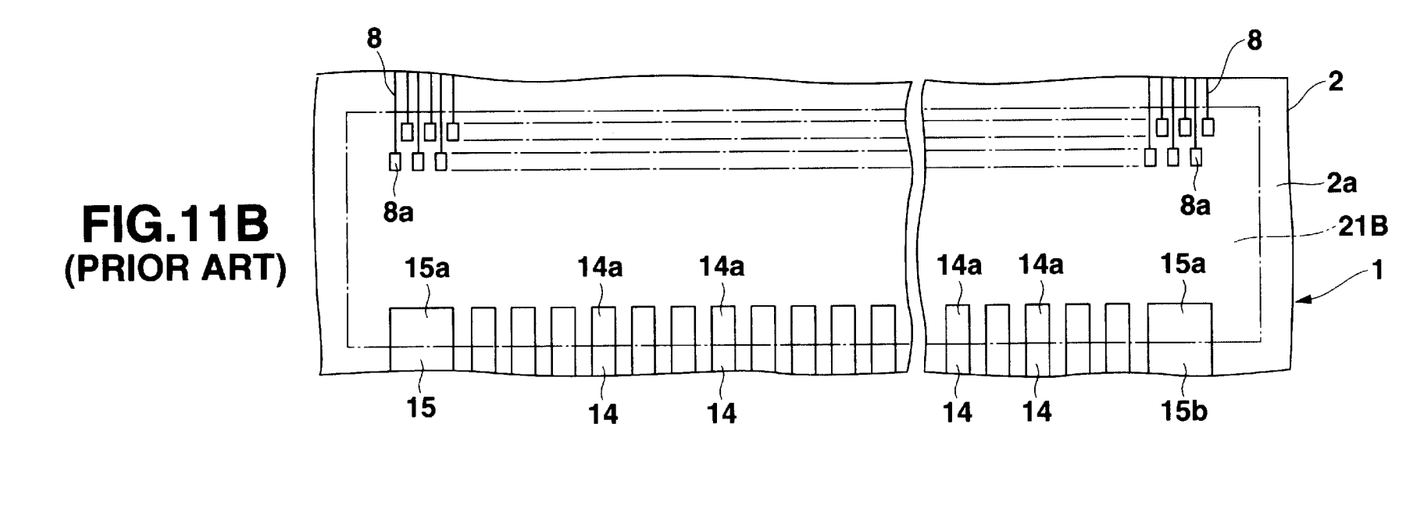
FIG. 11B is an enlarged plan view of the semiconductor chip mounting area on the liquid crystal display panel of FIG. 10A.

FIG. 11A is a transparent enlarged plan view to show the location of the terminals of the semiconductor chip 4 mounted on the semiconductor chip mounting area 21B of the liquid crystal display panel 1 of FIG. 11A (or an enlarged plan view showing only the terminal with the semiconductor body removed from above). FIG. 11B is an enlarged view of the semiconductor chip mounting area 21B of the liquid crystal display panel 1 shown in FIG. 10A. At the upper edge section inside the semiconductor chip mounting area 21B of the liquid crystal display panel 1, output electrode terminals 8a composed of one-end parts of a plurality of output wires 8 are provided in staggered fashion. At the lower edge section of the bottom surface of the semiconductor chip 4, a plurality of signal input bump electrodes 31 and five pairs of power supply pump electrodes 32 (two pairs are shown in FIG. 11A) are provided. At the upper edge section of the bottom surface, a plurality of output bump electrodes 33 are provided in staggered fashion. In the description, the power supply bump electrodes 32 are connected pair by pair inside the semiconductor chip 4, each pair corresponding to each electrode terminal 15a.

Then, with the semiconductor chips 4 bonded to the respective semiconductor chip mounting areas 21A to 21C of the liquid crystal display panel 1 using anisotropic conductive adhesive, the signal input bump electrodes 31, power supply bump electrodes 32, and output bump electrode 33 of the semiconductor chips 4 are connected to the electrode terminals 14a, 15a and output electrode terminals 8a inside each of the semiconductor chip mounting area 21A to 21C of the liquid crystal panel 1.

As shown in FIG. 9 and FIG. 10B, in the flexible wiring board 11 of such a conventional liquid crystal display unit, three connection wire groups 23 are provided in parallel on the bottom surface of the wide section 22a of the film 22, each group being composed of a plurality of input connection wires 24 and five power supply connection wires 25. Of the three groups, a plurality of input connection wires 24 and five power supply wires 25 constituting the two connection wire groups 23 on both sides are connected to a plurality of input connection wires 24 and five power supply connection wires 25 constituting the middle connection wire group 23 and the common running wires provided on the top surface of the wide section 22a of the film 22. As a result, the lateral length (the dimension in the vertical direction in FIG. 9) of the wide section 22a of the film 22 becomes larger, increasing the overall occupied area and therefore decreasing the number of films obtained from a base film of a constant area, which leads to a high cost problem.

BRIEF SUMMARY OF THE INVENTION

The object of the present invention is to decrease the occupied area of a flexible wiring board.

According to the present invention, there is provided a connection structure of a display panel and a wiring board, comprising: a display panel which has a display area and is composed of a plurality of semiconductor chip mounting areas, output wires that are formed so as to correspond to the semiconductor chip mounting areas respectively and supply driving signals to the display area, first and second input wires. Each of the first input wires having an electrode terminal located inside the semiconductor chip mounting area and an input terminal located outside the semiconductor chip mounting area, and the second input wires having junction sections for connecting electrode terminals respectively located inside adjacent ones, the semiconductor chip mounting area with each other, and input terminals arranged near outside the one located at one end of the semiconductor chip mounting areas; and a wiring board including connection wires connected to the input terminals of the first input wires arranged so as to correspond to the plurality of semiconductor chip mounting areas respectively and connection wires connected to the input terminals of the second input wires.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

<First Embodiment>

Figure 1:
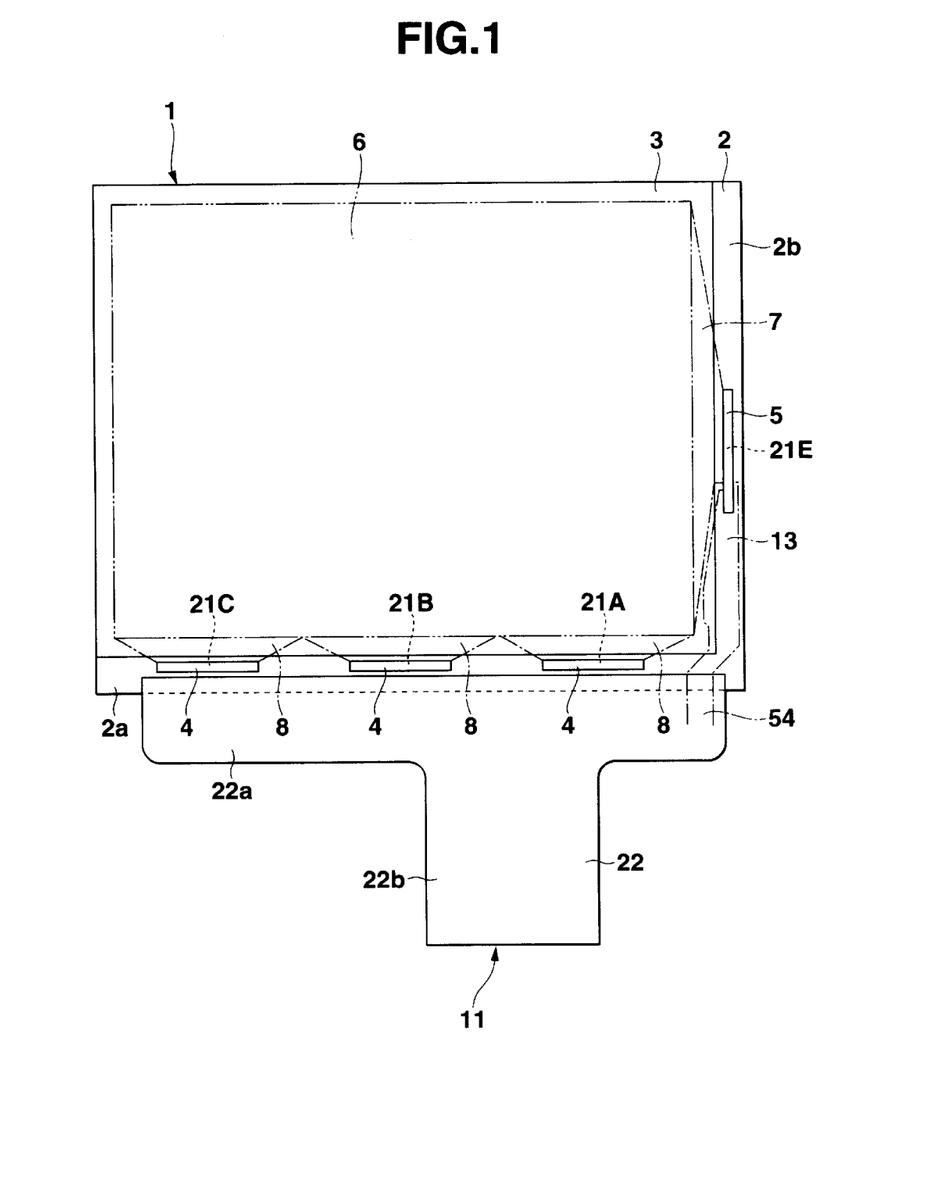
FIG. 1 is a plan view of a liquid crystal display unit according to a first embodiment of the present invention.
Figure 2A:
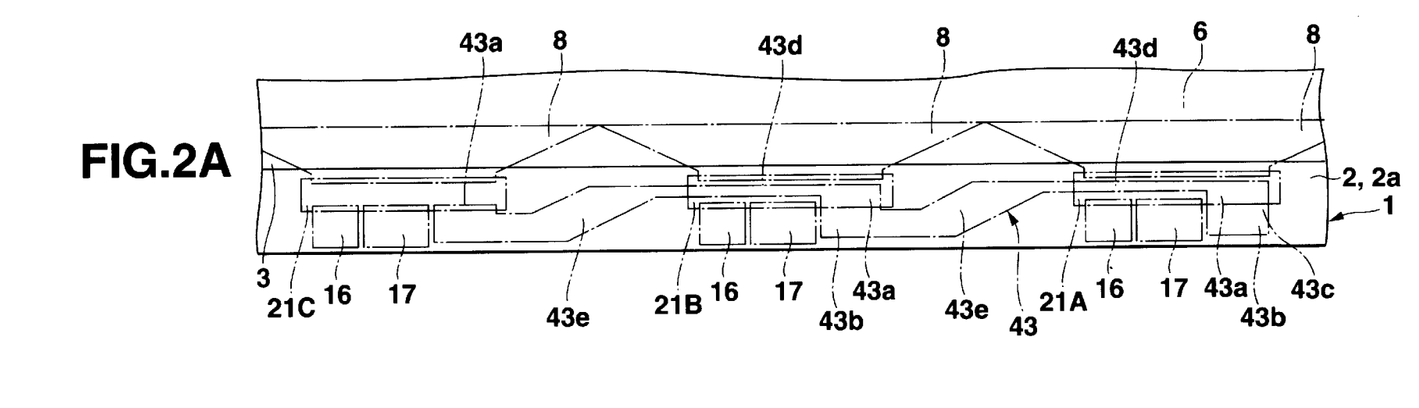
FIG. 2A is an enlarged plan view of part of the lower edge section of the liquid crystal display panel in FIG. 1.
Figure 2B:
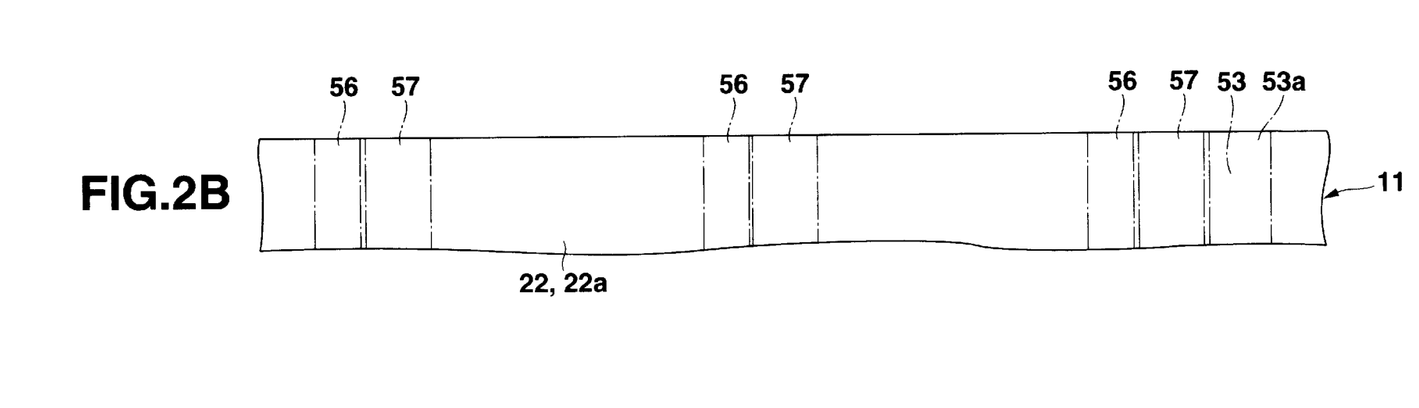
FIG. 2B is a transparent enlarged sectional view of the part of a flexible wiring board corresponding to the liquid crystal display panel of FIG. 2A and an enlarged plan view, with specific portions broken away.
Figure 3A:
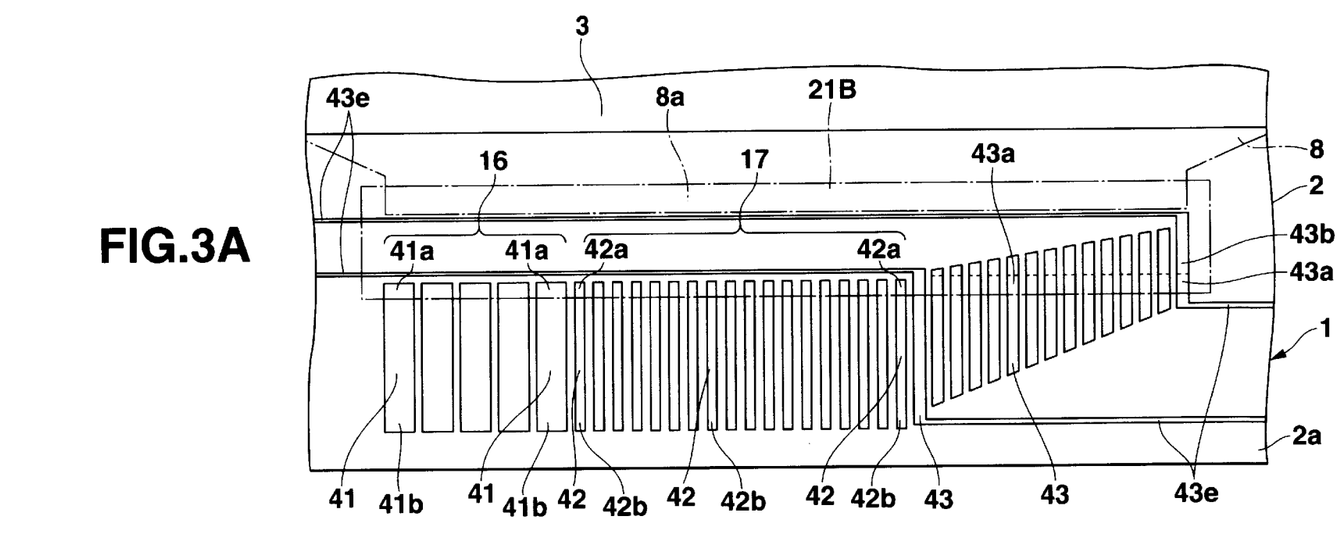
FIG. 3A is an enlarged plan view of the semiconductor chip mounting area in the central part of the liquid crystal display panel and its peripheral area shown in FIG. 2A.
Figure 3B:
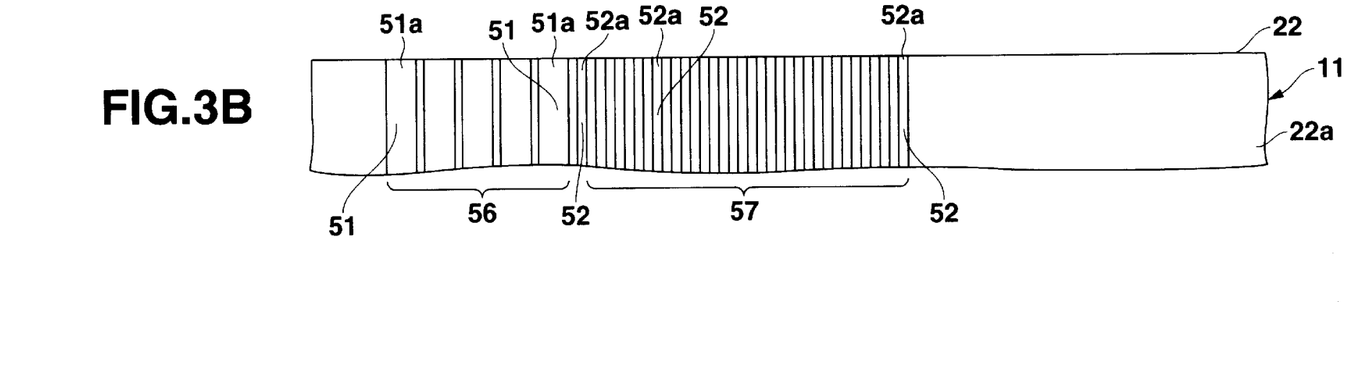
FIG. 3B is a transparent enlarged sectional view of the part of the flexible wiring board corresponding to the area of the liquid crystal display panel shown in FIG. 3A.
Figure 4A:
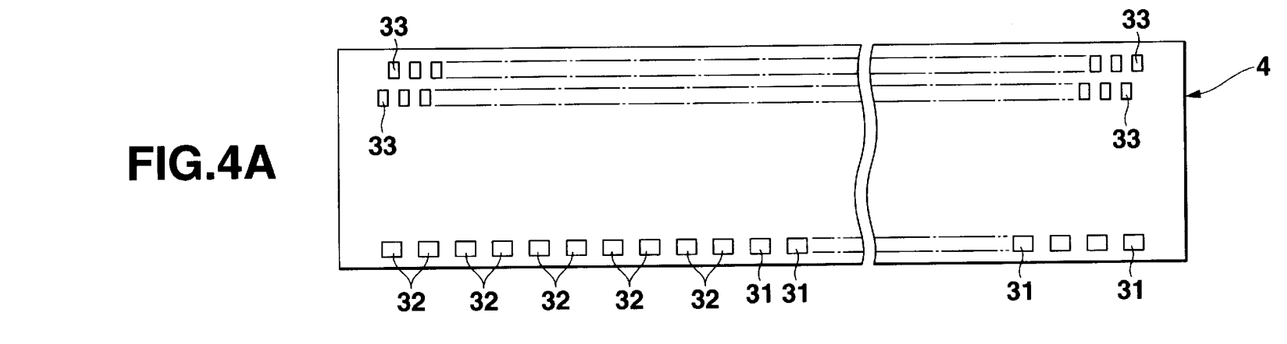
FIG. 4A is a transparent enlarged plan view showing the location of the terminals of a semiconductor chip mounted on the semiconductor chip mounting area on the liquid crystal display panel of FIG. 3A.
Figure 4B:
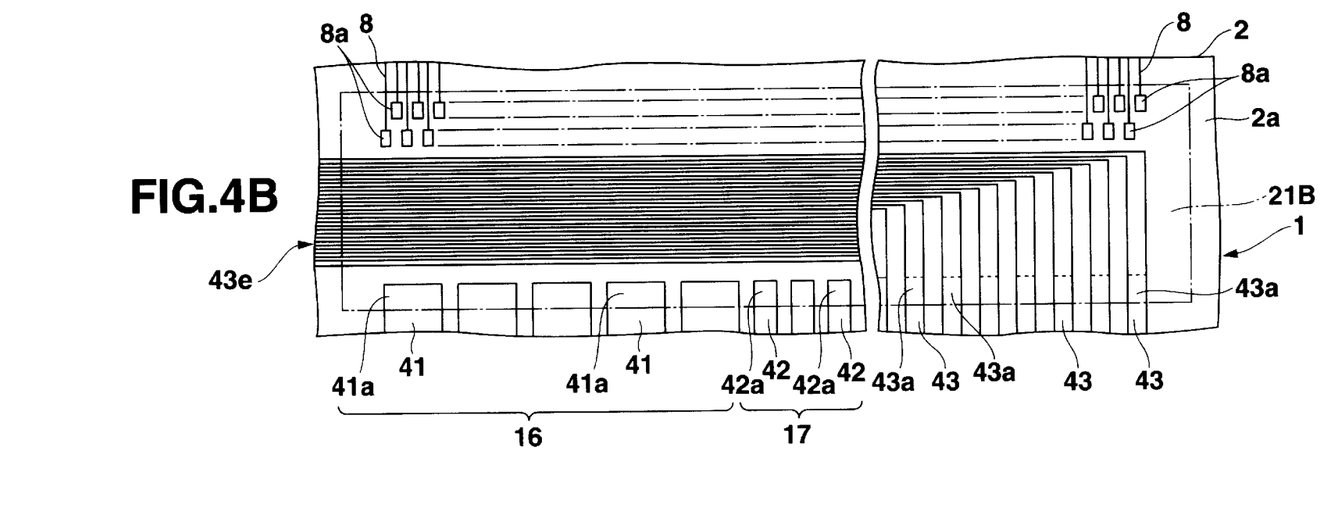
FIG. 4B is an enlarged plan view of the semiconductor chip mounting area on the liquid crystal display panel of FIG. 3A.

FIG. 1 is a plan view of a liquid crystal display unit according to a first embodiment of the present invention. FIG. 2A is an enlarged plan view of part of the lower edge section of the liquid crystal display panel in FIG. 1. FIG. 2B is a transparent enlarged plan view of the part of a flexible wiring board corresponding to the lower edge section of the liquid crystal display panel in FIG. 2A (or an enlarged plan view, with the film removed from above). FIG. 3A is an enlarged plan view of the semiconductor chip mounting area in the central part of the liquid crystal display panel and its peripheral area shown in FIG. 2A. FIG. 3B is a transparent enlarged plan view of the part of the flexible wiring board corresponding to the area of the liquid crystal display panel shown in FIG. 3A (or an enlarged sectional view, with the film removed from above). FIG. 4A is a transparent enlarged plan view showing the location of the terminals of a semiconductor chip mounted on the semiconductor chip mounting area on the liquid crystal display panel of FIG. 3A (or an enlarged sectional view, with the semiconductor substrate removed from above). FIG. 4B is an enlarged plan view of the semiconductor chip mounting area on the liquid crystal display panel of FIG. 3A. In these figures, the members basically the same as those in FIGS. 9, 10A, 10B, 11A, and 11B are indicated by the same reference numerals and explanation of them will be omitted suitably.

As shown in FIG. 4A, in a semiconductor chip 4 used in the embodiment, five pairs of power supply bump electrodes 32 are provided on the left side of the lower edge section on the bottom surface of the chip, a plurality of signal input bump electrodes 31 are provided on the right side of the lower edge section on the bottom surface, and a plurality of output bump electrodes 33 are provided in staggered fashion on the upper edge section of the bottom surface.

According to the specification of the semiconductor chip 4, a power supply wire group 16 having five power supply wires 41 arranged on the left end side, a first signal input wire group 17 having a plurality of first signal input wires 42 (see FIG. 3A), and a plurality of second signal input wires 43 (see FIG. 3A) is provided on the lower edge section inside each of semiconductor chip mounting areas 21A, 21B, 21C (in FIG. 4B, only the middle mounting area 21B is shown) on a liquid crystal display panel 1 as shown in FIG. 4B. Each first signal input wire 42 has a first input electrode terminal 42a at its upper end. Each power supply wire 41 has a power supply electrode terminal 41a at its upper end. Each second signal input wire 43 has a second input electrode terminal 43a in its middle portion. On the upper edge section of each mounting area, a plurality of output electrode terminals 8a are arranged in staggered fashion. Each output electrode terminal 8a is connected to an output wire 8 (see FIG. 1) extended to a display area 6.

FIG. 3A is an enlarged plan view of the vicinity of the middle one 21B of the semiconductor chip mounting areas 21A, 21B, 21C arranged on the lower edge section 2a of a lower glass substrate 2. As shown in FIG. 3A, the power supply wires 41 are extended straightly from the power supply electrode terminals 41a to the lower end edge of the lower glass substrate 2 and have power supply terminals 41b at their ends. The first signal input wires 42 are extended straightly to the lower end edge of the lower glass substrate 2 and have second signal input terminals 42b at their ends.

Next, the second signal input wires 43 will be explained. In the middle semiconductor chip mounting area 21B of FIG. 2A, each second signal input wire 43 is extended upward from the second signal input terminal 43a, bent almost at right angles inside the semiconductor chip mounting area 21B, and further extended straightly to the left. Its tip portion is extended outside the semiconductor chip mounting area 21B, and further extended from the second signal input electrode terminal 43a downward outside the semiconductor chip mounting area 21B. Thereafter, it is bent at right angles and extended straightly to the right.

Specifically, as shown in FIG. 2A, each second signal input wire 43 is composed of a junction section 43c for connecting the second signal input terminal 43b connected to the flexible wiring board 11 with the second signal input electrode terminal 43a inside the semiconductor chip mounting area 21A, an inside semiconductor chip mounting area junction section 43d extended in the longitudinal direction inside the semiconductor chip mounting area 21A, an outside semiconductor chip mounting area junction section 43e for connecting the inside semiconductor chip mounting area junction section 43d with the second signal input electrode connecting terminal 43a inside the semiconductor chip mounting area 21B, an inside semiconductor chip mounting area junction section 43d extended in the longitudinal direction inside the semiconductor chip mounting area 21B, and an outside semiconductor chip mounting area junction section 43e for connecting the inside semiconductor chip mounting area junction section 43d with the second signal input electrode connecting terminal 43a inside the semiconductor chip mounting area 21C. The second signal input wire 43 is run over the top surface of the lower edge section 2a of the lower glass substrate 2 in the aforementioned order. With this arrangement, the signal input electrode terminals 43a provided in the respective semiconductor chip mounting areas 21A, 21B, 21C are connected to a common signal input line.

As shown in FIG. 1, the flexible wiring board 11 includes a film 22 having a wider section 22a whose length (the length in the longitudinal direction of the display panel) is shorter and a narrow section 22b extended from almost the middle of the lower part of the wide section 22a. As shown in FIGS. 1, 2B, and 3B, three power supply connection wire groups 56 corresponding to the three power supply wire groups 16, three signal input connection wire groups 57 corresponding to the three first signal input wire groups 17, and a plurality of input connection wires 53 corresponding to the second signal input terminals 43b of the second signal input wires are formed on the bottom surface of the wide section 22a of the film 22. Each power supply connection wire group 56 has five power supply connection wires 51. Each power supply connection wire 51 has, at its upper end, a connection terminal 51a connected to the power supply terminal 41b. Each signal input connection group 57 has a plurality of signal input connection wires 52. Each signal input connection wire 52 has, at its upper end, a connection terminal 52a connected to the signal input terminal 42b. In this case, as seen from FIG. 2A, the flexible wiring board 11 is not provided with a connection terminal directly connected to the second input electrode terminal 43a inside the semiconductor chip mounting areas 21B and 21C.

In FIGS. 1 and 2B, the five power supply connection wires 51 of the power supply connection wire group 56 and the signal input connection wires 52 of the signal input connection wire group 57, which are arranged so as to correspond to the semiconductor chip mounting area 21A, are extended to the lower end edge of the narrow section 22b of the film 22 and connected to a circuit board (not shown). On the other hand, the five power supply connection wires 51 of the power supply connection wire group 56 and the signal input connection wires 52 of the signal input connection wire group 57, which are arranged so as to correspond to the semiconductor chip mounting areas 21B and 21C, are connected via through holes (not shown) and running wires formed so as to traverse the power supply connection wires 51 and signal input connection wires 52 on the top surface of the film to the five power supply connection wires 51 of the power supply connection wire group 56 and the signal input connection wires 52 of the signal input connection wire group 57, which are arranged so as to correspond to the semiconductor chip mounting area 21A.

The following is an explanation of part of the bottom surface of one end of the flexible wiring board 11 bonded to the top surface of the lower edge section 2a of the lower glass substrate 2 outside the semiconductor chip mounting areas 21A to 21C with anisotropic conductive adhesive (not shown). The connection terminal 51a and connection terminal 52a of the flexible wiring board 11 will be explained by reference to FIGS. 3A and 3B. The connection terminal 51a is connected via the power supply terminal 41b to the power supply electrode terminal 41a in the semiconductor chip mounting area 21A, 21B, or 21C. The connection terminal 52a is connected via the first signal input terminal 42b to the first input electrode terminal 42a in the semiconductor chip mounting area 21A, 21B, or 21C.

The connection terminal 53a of the flexible wiring board 11 will be described by reference to FIG. 2B. The connection terminal 53a is connected via the second signal input terminal 43b to the second signal input wire 43 and, as shown in FIG. 2A, is connected to the second signal input electrode terminal 43a in each of the semiconductor chip mounting areas 21A, 21B, 21C via the inside semiconductor chip mounting area junction section 43d and outside semiconductor chip mounting area junction section 43e.

As described above, because the second signal input electrode terminals 43a in the semiconductor chip mounting areas 21A, 21B, 21C arranged on the liquid crystal display panel 1 are connected to each other via the second signal input wires 43 having the inside semiconductor chip mounting area junction section 43d and outside semiconductor chip mounting area junction section 43e, there is no need to provide connection terminals directly connected to the second input electrode terminals 43a in the middle and left-side semiconductor chip mounting areas 21B and 21C of the liquid crystal display panel 1, which decreases the number of running wires provided on the flexible wiring board 11. As a result, the length of the wide section 22a of the film 22 may be made shorter and the occupied area of the flexible wiring board 11 may be made smaller. Consequently, the number of films obtained from a base film of a constant area increases and the cost of the flexible wiring board 11 may be reduced.

In the above explanation, the power supply wire 41 formed on the lower edge section 2a of the lower glass substrate 2 is made of ITO. In the embodiment, since the power supply connection wires 51 corresponding to the semiconductor chip mounting areas 21B and 21C are connected to the power supply connection wires 51 arranged so as to correspond to the semiconductor chip mounting area 2A by means of running wires formed on the top surface of the flexible wiring board 11 and the wires on the wiring board are generally made of low-resistance copper, aluminum, or the like, a voltage drop on the power supply line is suppressed.

Furthermore, since in the liquid crystal display unit, the inside semiconductor chip mounting area junction section 43d of each second signal input wire 43 on the top surface of the lower edge section of the lower glass substrate 2 of the liquid crystal display panel 1 is provided in the semiconductor chip mounting area 21A, 21B, or 21C, the width of the lower edge 2a of the lower glass substrate 2 can be made smaller and therefore the size of the liquid crystal display unit be made smaller.

In the first embodiment, since the five power supply connection wires 51 of the power supply connection wire group 56 and the signal input connection wires 52 of the signal input connection wire group 57, which are arranged so as to correspond to the semiconductor chip mounting areas 21B and 21C, are connected via through holes and running wires formed so as to traverse the power supply connection wires 51 and signal input connection wires 52 on the top surface of the film 22 to the five power supply connection wires 51 of the power supply connection wire group 56 and the signal input connection wires 52 of the signal input connection wire group 57, which are arranged so as to correspond to the semiconductor chip mounting area 21A, the flexible wiring substrate 11 has been a double-sided wiring board. The flexible wiring substrate 11, however, may be a single-sided wiring board only on one side of which wiring is done. Hereinafter, an embodiment of the present invention using a single-sided wiring board will be explained.

<Second Embodiment>

Figure 5:
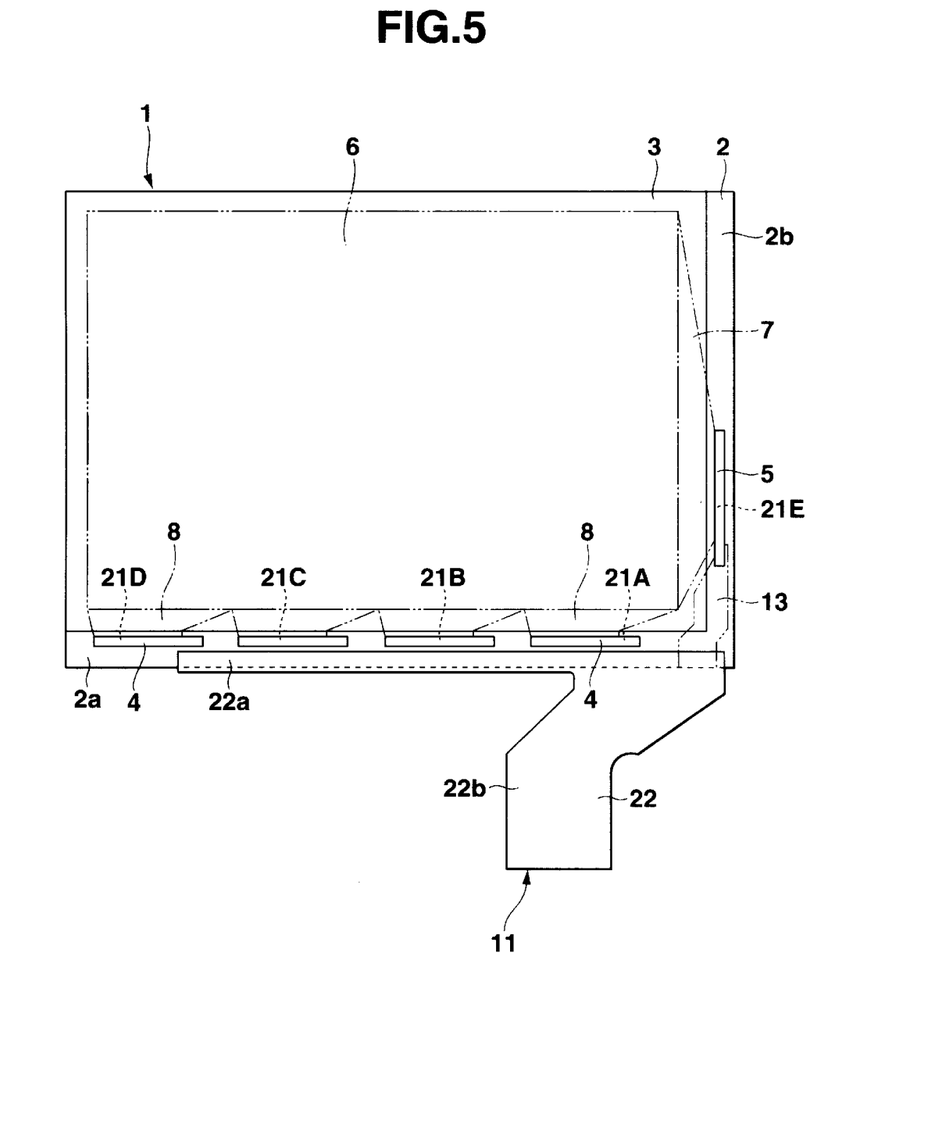
FIG. 5 is a plan view of the main part of a liquid crystal display unit according to a second embodiment of the present invention.
Figures 6A, 6B:
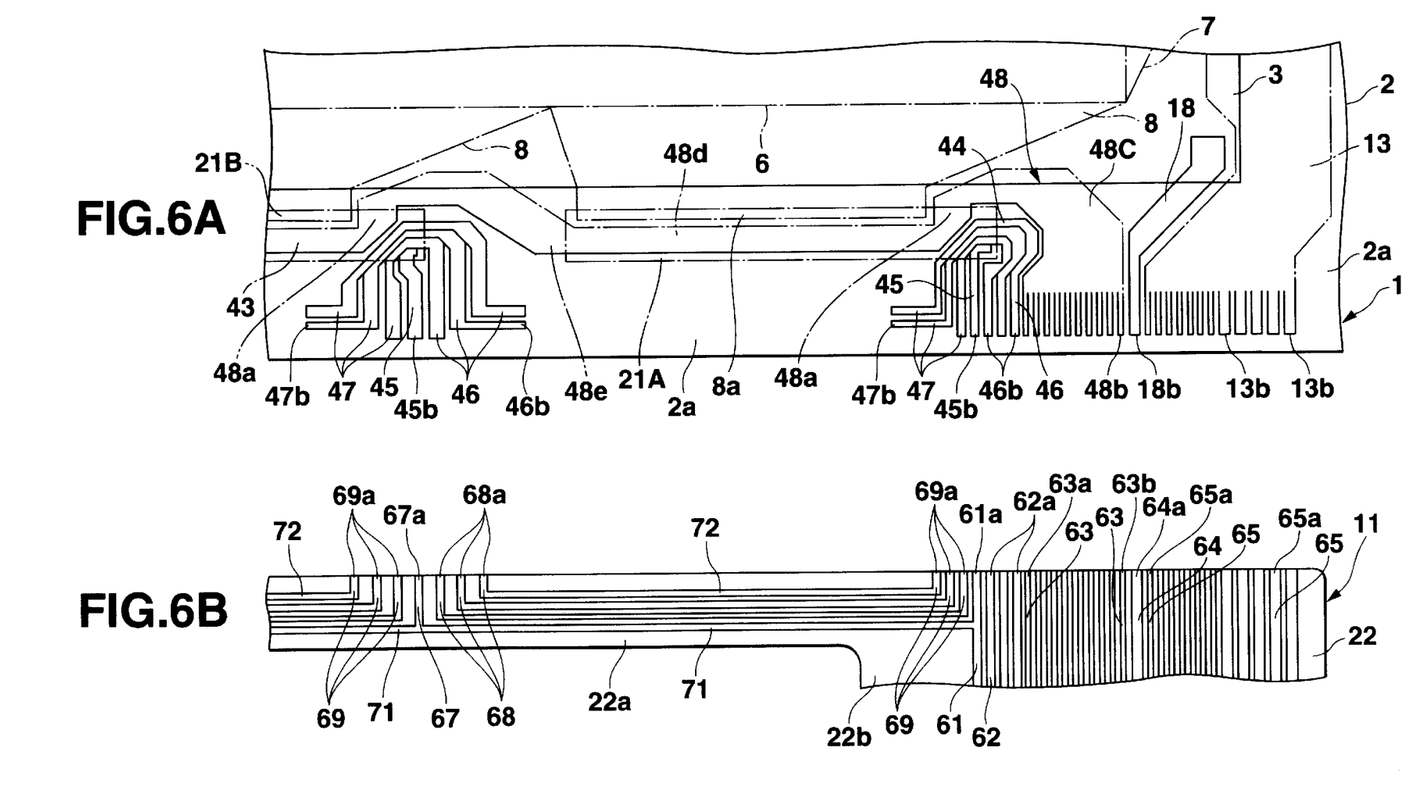
FIG. 6A is an enlarged plan view of the main part of the lower edge section of the liquid crystal display panel in FIG. 5.
FIG. 6B is a transparent enlarged plan view of the part of the flexible board corresponding to the lower edge section of the liquid crystal display panel in FIG. 6A.
Figure 7A:
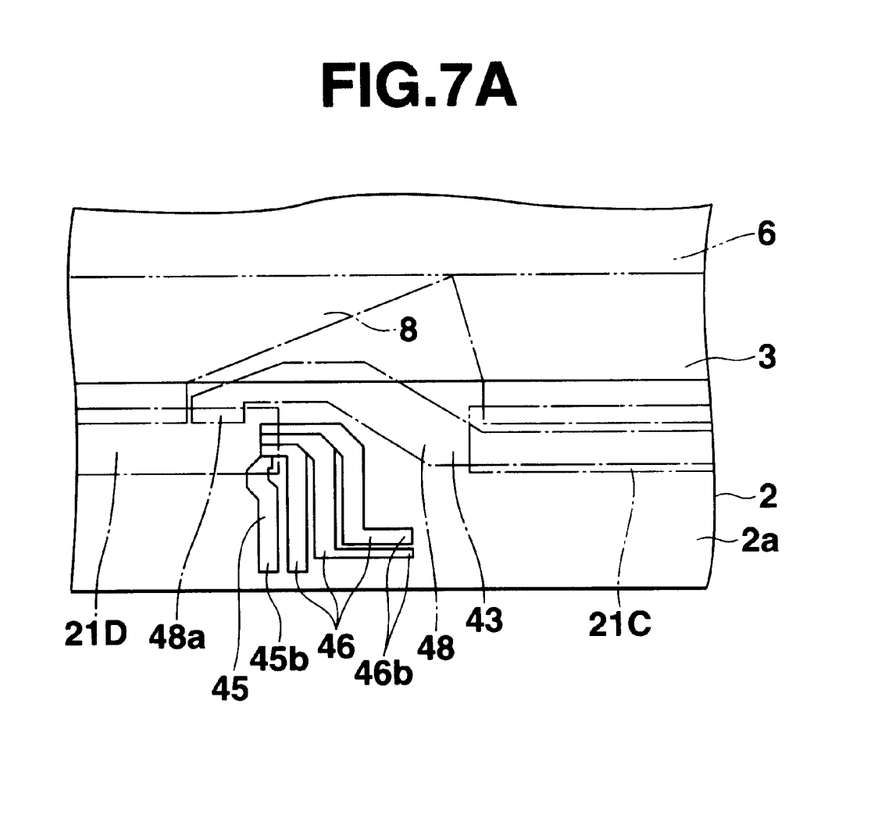
FIG. 7A is an enlarged plan view of the main part of the peripheral portion of the semiconductor chip mounting area shown in FIG. 6A.
Figure 7B:
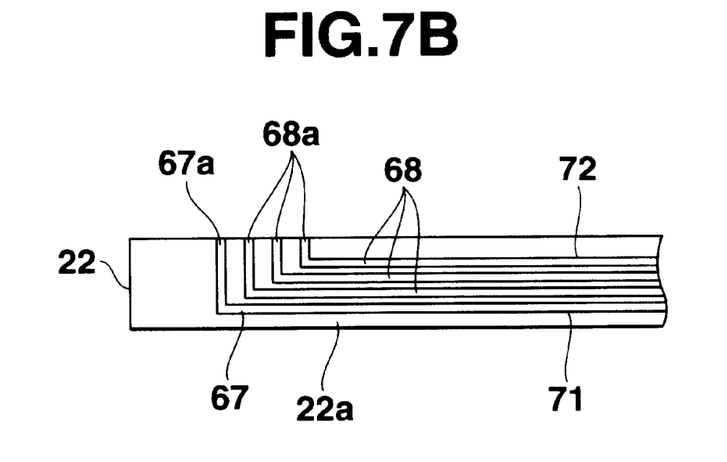
FIG. 7B is a transparent enlarged plan view of the part of the flexible board corresponding to FIG. 7A.
Figure 8A:
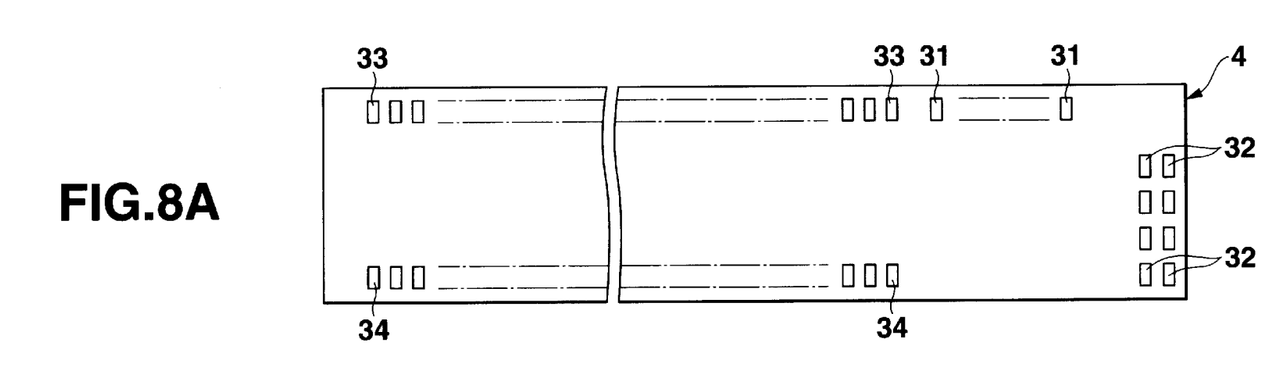
FIG. 8A is a transparent enlarged plan view of a semiconductor chip mounted on the semiconductor chip mounting area shown in FIG. 6A.
Figure 8B:
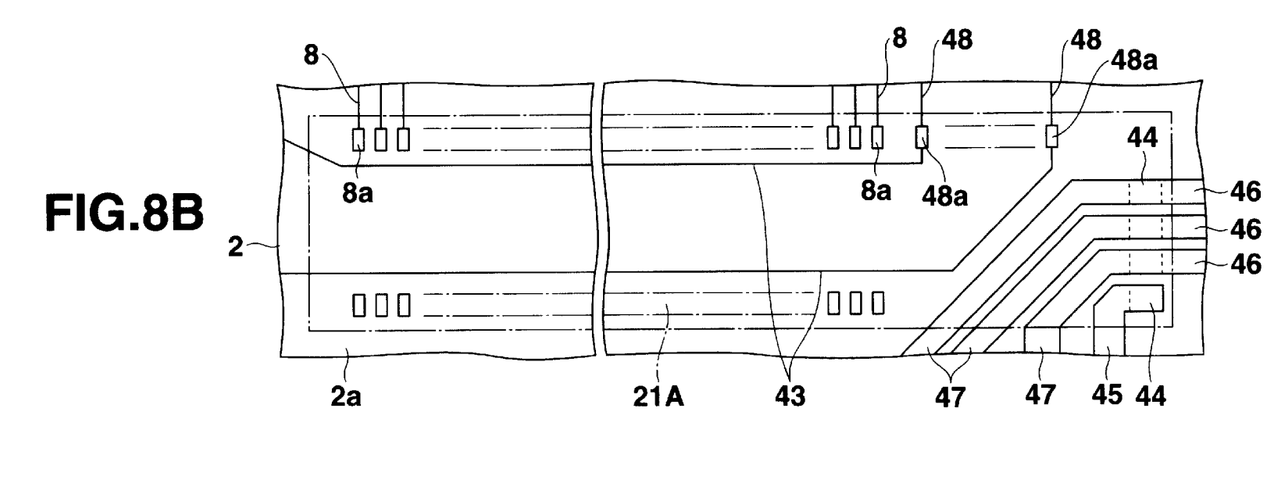
FIG. 8B is an enlarged plan view of the semiconductor chip mounting area in FIG. 6A.

FIG. 5 is a plan view of the main part of a liquid crystal display unit according to a second embodiment of the present invention. FIG. 6A is an enlarged plan view of part of the lower edge section of the liquid crystal display panel in FIG. 5. FIG. 6B is a transparent enlarged plan view of the part of the flexible board corresponding to the lower edge section of the liquid crystal display panel in FIG. 6A (or an enlarged plan view, with the film removed from above). FIG. 7A is an enlarged plan view of the main part of FIG. 6A. FIG. 7B is a transparent enlarged plan view of the part of the flexible board corresponding to FIG. 7A (or an enlarged plan view, with the film removed from above). FIG. 8A is a transparent enlarged plan view of a semiconductor chip mounted on the semiconductor chip mounting area shown in FIG. 6A (or an enlarged plan view, with the semiconductor body removed from above). FIG. 8B is an enlarged plan view of the semiconductor chip mounting area in FIG. 6A. In these figures, the same parts are indicated by the same reference numerals and explanation of them will be omitted suitably.

The liquid crystal display panel 1 in the second embodiment has four semiconductor chip mounting areas 21A, 21B, 21C, and 21D on the lower edge section 2a of the lower glass substrate 2. Of the input wires for imputing signals to the respective semiconductor chips 4 mounted in the semiconductor chip mounting areas 21A, 21B, 21C, 21D, each of the signal input wires 48 has a signal input electrode terminal 48a provided on the top right section inside each of the semiconductor chip mounting areas 21A, 21B, 21C, 21D. In the semiconductor chip mounting area 21A at right, as shown in FIG. 6A, there is provided a signal input terminal 48b extending from the signal input electrode terminal 48a provided in the semiconductor chip mounting area 21A to the vicinity of the projecting end of the lower part of the lower glass substrate 2 on the right side of the semiconductor chip mounting area 21A. In the second embodiment, each signal input wire 48, is connected to the signal input electrode terminal 48a inside the semiconductor chip mounting area 21B at the next stage via the signal input terminal 48b connected to the flexible wiring board 11, a junction section 48c for connecting the signal input terminal 48b to the signal input electrode terminal 48a inside the semiconductor chip mounting area 21A, an inside semiconductor chip mounting area junction section 48d extended in the longitudinal direction inside the semiconductor chip mounting area 21A, and an outside semiconductor chip mounting area junction section 48e for connecting the inside semiconductor chip mounting area junction section 48d to the second signal input electrode terminal 48a inside the semiconductor chip mounting area 21B. Although not shown, the signal input wire 48 extending from the signal input electrode terminal 48a inside the second semiconductor chip mounting area 21B is then connected to the signal input electrode terminal 48a inside the third semiconductor chip mounting area 21C at the next stage via the inside semiconductor chip mounting area junction section 48d and the outside semiconductor chip mounting area junction section 48e. Similarly, the signal input wire 48 extending from the signal input electrode terminal 48a inside the third semiconductor chip mounting area 21C is then connected to the signal input electrode terminal 48a inside the fourth semiconductor chip mounting area 21D at the last stage via the inside semiconductor chip mounting area junction section 48d and the outside semiconductor chip mounting area junction section 48e. With these connections, the respective signal input electrode terminals 48a arranged in the semiconductor chip mounting areas 21A, 21B, 21C and 21D are connected to the common signal input line. In this case, in each semiconductor chip mounting area, wiring is done in such a manner that the wires fit in the width of the area over its overall length. The outside semiconductor chip mounting area junction sections 48e between the semiconductor chip mounting areas 21A and 21B, between the semiconductor chip mounting areas 21B and 21C, and between the semiconductor chip mounting areas 21C and 21D make a power supply wire run around the display area 6, which will be explained below.

As shown in FIG. 8B, the power supply wire is composed of four power supply electrode terminals 44 provided on right side within the semiconductor chip mounting area 21A, a power supply wire 45 extended from the lowest power supply electrode terminal 44 in FIG. 8B downward to the vicinity of the lower end edge of the lower glass substrate 2, power supply wires 46 extended from the remaining three power supply electrode terminals 44 toward the lower right side as far as the vicinity of the lower end edge of the lower glass substrate 2, and a power supply wire 47 extended from the remaining three power supply electrode terminal 44 toward the lower left side as far as the vicinity of the lower end edge of the lower glass substrate 2. In this case, the leftmost semiconductor chip mounting area 21D is not provided with the power supply wire 47, as shown in FIG. 7A. That is, since the power supply wire 47 is for applying the power supply voltage supplied to the power supply electrode terminal 44 via the power supply wire 46 to the semiconductor chip 4 at the next stage, it is unnecessary in the semiconductor chip mounting area 21D at the last stage. Although the tips of the power supply wires are shaped like almost the letter L or the opposite of the letter L, they may be straight as are the other power supply wires. The power supply wires 45, 46, 47 have power supply terminals 45b, 46b, 47b, respectively, in the vicinity of the lower edge section of the lower glass substrate 2. As shown in FIG. 8A, four pairs of power supply bump electrodes 32 are provided on the right side of the bottom surface of the semiconductor chip 4.

As shown in FIG. 5, the flexible wiring board 11 is provided with a film 22 having a wide section 22a shorter in length and a narrow section 22b extending from almost the middle of the lower part of the wide section 22a. On the bottom surface of the wide section 22a of the film 22, as shown in FIG. 6B, there are provided connection wires 61, 62 connected to the power supply wires 45, 46 respectively, connection wires 63 connected to the signal input wires 48, and a cross connection wire 64 and input connection wires 65 connected to the cross wires 18 and the input wire 13 respectively. A cross connection wire 64 formed on the lower glass substrate 2 is for supplying a common potential to a common electrode formed on the inside face of the upper glass substrate 3 via a conductive member sandwiched between the lower glass substrate 2 and upper glass substrate 3. These connection wires 61 to 65 have connection terminals 61a to 65a respectively, connected to the terminals 45b, 46b, 18b, 13b formed on the respective wires 45, 46, 18, 13. The connection wires 61 to 65 are extended to the lower end edge of the narrow section 22b of the film 22 and connected to a circuit board (not shown).

On the bottom surface of the wide section 22a of the film 22, there are provided connection wires 67, 68, 69 connected to the power supply wires 45, 46 (or the power supply wires at left in FIG. 6A) and power supply wire 47, respectively. Of them, the connection wire 67 is connected to the connection wire 61 via a junction wire 71 provided on the bottom surface of the wide section 22a of the film 22. The connection wire 68 at left and the connection wire 69 at right are connected to each other via a junction wire 72 provided on the bottom surface of the wide section 22a of the film 22. The connection wires 67, 68, 69 have connection terminals 67a, 68a, 69a respectively, connected to the terminals 45b, 46b, 47b formed on the respective wires 45, 46, 47.

The following is an explanation of part of the bottom surface of one end of the flexible wiring board 11 bonded to the top surface of the lower edge section 2a of the lower glass substrate 2 with anisotropic conductive adhesive (not shown). The connection wire 63 of the flexible wiring board 11 is connected to the signal input terminal 48 inside the semiconductor chip mounting area 21A of FIG. 6A via the signal input wire 48 and further connected to the signal input electrode terminal 48a inside each of the semiconductor chip mounting areas 21A to 21D via the inside semiconductor chip mounting area junction section 48d and outside semiconductor chip mounting area junction section 48e.

The connection wires 61, 67 of the flexible wiring board 11 are connected to the lowest power supply electrode terminal 44 in FIG. 8B inside the semiconductor chip mounting area 21A via the power supply wire 45. The connection wire 67 is connected via the junction wire 71 to all the power supply terminals 44 inside the semiconductor chip mounting areas 21A to 21D.

The connection wires 62 of the flexible wiring board 11 are connected to the remaining three power supply electrode terminals 44 inside the semiconductor chip mounting area 21A via the power supply wires 46 and further connected to the power supply electrode terminals 44 inside each of the semiconductor chip mounting areas 21B to 21D via the power supply wires 47 at left. Specifically, the connection wires 69 of the flexible wiring board 11 are connected to the corresponding power supply wires 47 respectively, further connected to the power supply wires 46 at the next stage via the junction wires 72, and then connected to the corresponding power supply electrode terminals 44 in the same stage. In this way, all the power supply electrode terminals 44 inside the semiconductor chip mounting areas 21A to 21D are connected to the connection wires 61 or 62.

As described above, in the liquid crystal display unit, the power supply electrode terminals 44 in the four semiconductor chip mounting areas 21A to 21D on the liquid crystal display panel 1 are arranged in the direction perpendicular to the side end of the lower edge section 2a of the lower glass substrate 2. One power supply electrode terminal 44 is extended straightly by a single power supply wire 45 to the side end of the lower edge section 2a. The remaining power supply electrode terminals 44 are extended by the concentric power supply wires 46 and 47 in such a manner that they traverse the power supply wire 45 toward both sides. The connection wire 62 connected to the power supply wire 46 and the connection wire 69 connected to the power supply wire 47 are formed on the flexible wiring substrate 11. With this configuration, even when the flexible wiring board 11 is a single-sided wiring board, all the power supply electrode terminals 44 can be connected to the common connection wire 62. Moreover, because the connection wires 67, 68, 69 and junction wires 71, 72 are provided on the wide section 22a of the film 22 on the flexible wiring board 11, the width of the wide section 22a of the film 22 becomes smaller, which decreases the occupied area of the flexible wiring board 11 and therefor reduces the cost of the flexible wiring board 11 remarkably.

In the above embodiment, of the power supply electrode terminals 44 provided in the four semiconductor chip mounting areas 21A to 21D on the liquid crystal display panel 1, the lowest power supply terminal 44 in FIG. 8B may be connected to the concentric power supply wires 46 and 47 as are the other power supply electrode terminals 44. In this specification, the concentric wires mean that the outer wires are laid in parallel so as not to cross the inner wires. They may be shaped like an arc, a rectangle, or a triangle. While in the above embodiment, the signal input junction line 48 is provided on the liquid crystal display panel 1, it may be provided on the bottom surface of the wide section 22a of the film 22 on the flexible wiring board 11 as are the junction wires 71, 72.

As has been explained above, with the present invention, since the signal input electrode terminals 43a, 48a in the semiconductor chip mounting areas 21A, 21B, 21C arranged on the liquid crystal display panel 1 are connected to each other by means of the signal input wires 43, 48 having the inside semiconductor chip mounting areas 43d, 48d and the outside semiconductor chip mounting areas 43e, 48e, there is no need to provide connection terminals directly connected to the signal input electrode terminals 43a, 48a in the semiconductor chip mounting areas 21B, 21C in the middle and on the left side of the liquid crystal display panel 1. As a result, the number of wires provided on the flexible wiring board 11 decreases, which decreases the length of the wide section 22a of the film 22 and therefor reduces the occupied area of the flexible wiring board 11. Consequently, the number of films 22 obtained from a base film with a constant area increases, which reduces the cost of the flexible wiring board 11.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A connection structure of a display panel and a wiring board, comprising:

a display panel which has a display area and is composed of a plurality of semiconductor chip mounting areas, output wires that are formed so as to correspond to said semiconductor chip mounting areas respectively and supply driving signals to said display area, first input wires, and second input wires, each of said first input wires having an electrode terminal located inside each of said semiconductor chip mounting areas and an input terminal located outside each of said semiconductor chip mounting areas, and said second input wires having junction sections for connecting electrode terminals respectively located inside adjacent ones of said semiconductor chip mounting areas with each other, and input terminals arranged near outside the one located at one end of said semiconductor chip mounting areas; and a wiring board including connection wires connected to the input terminals of said first input wires arranged so as to correspond to said plurality of semiconductor chip mounting areas respectively and connection wires connected to said input terminals of said second input wires.

2. The connection structure according to claim 1, wherein said second input wires include junction sections extended inside each of said semiconductor chip mounting areas, excluding said semiconductor chip mounting area at the last stage.

3. The connection structure according to claim 1, wherein said first input wires include power supply wires.

4. The connection structure according to claim 3, wherein said first input wires include signal input wires.

5. The connection structure according to claim 1, wherein the input terminals of said first input wires and said input terminals of said second input wires are arranged along a side edge of one side edge section of the wiring board.

6. The connection structure according to claim 1, wherein said first input wires and said second input wires are made of ITO.

7. The connection structure according to claim 1, wherein said first input wires include third input wires connected to the first input wires and said wiring board has connection wires for connecting said third input wires with said input wires in said semiconductor chip mounting areas adjacent to the third input wires.

8. The connection structure according to claim 1, wherein said wiring board has one face, on which all of said connection wires are formed.

9. A connection structure of a display panel and a wiring board, comprising:

a display panel which has a display area and is composed of a plurality of semiconductor chip mounting areas, output wires that are formed so as to correspond to said semiconductor chip mounting areas respectively and are for supplying driving signals to said display area, a plurality of electrode terminals arranged inside each of said semiconductor chip mounting areas, and a plurality of input wires that are connected to the corresponding ones of said electrode terminals and run concentrically from the upper-stage side to lower-stage side of each of said semiconductor chip mounting areas without crossing each other in such a manner that their arrangement order is reversed with respect to the upper-stage side and the lower-stage side; and a wiring board including connection wires connected to the input terminals of said input wires arranged so as to correspond to said plurality of semiconductor chip mounting areas respectively and connection wires for connecting the ones of said input terminals located in said semiconductor chip mounting areas on the lower-stage side with the electrode terminals located in said semiconductor chip mounting areas on the upper-stage side.

10. The connection structure according to claim 9, wherein said wiring board has one face and all of said connection wires are formed on said one face.

11. The connection structure according to claim 9, wherein said electrode terminals are used for power supply.

12. The connection structure according to claim 9, wherein said semiconductor chip mounting areas have a plurality of signal input electrode terminals formed therein, each of said signal input electrode terminals being connected to the corresponding one of said signal input electrode terminals inside the remaining ones of said semiconductor chip mounting areas by means of a signal input wire formed on said display panel.

13. The connection structure according to claim 12, wherein each of said signal input wires includes an inside semiconductor chip mounting area junction section formed inside each of said semiconductor chip mounting areas.

14. The connection structure according to claim 12, wherein said wiring board has a connection wire connected to said signal input wire.

* * * * *